United States Patent
Towns et al.

(10) Patent No.: US 6,858,324 B2
(45) Date of Patent: Feb. 22, 2005

(54) COPOLYMER

(75) Inventors: Carl Towns, Essex (GB); Richard O'Dell, Taufkirchen (DE)

(73) Assignee: Cambridge Display Technology Limited, Cambridge (GB)

(*) Notice: Subject to any disclaimer, the term of this patent is extended or adjusted under 35 U.S.C. 154(b) by 91 days.

(21) Appl. No.: 10/221,060

(22) PCT Filed: Mar. 9, 2001

(86) PCT No.: PCT/GB01/01037

§ 371 (c)(1),
(2), (4) Date: Dec. 19, 2002

(87) PCT Pub. No.: WO01/66618

PCT Pub. Date: Sep. 13, 2001

(65) Prior Publication Data

US 2003/0194577 A1 Oct. 16, 2003

Related U.S. Application Data

(60) Provisional application No. 60/205,266, filed on May 18, 2000.

(30) Foreign Application Priority Data

Mar. 10, 2000 (GB) .............................................. 0005842
Mar. 13, 2000 (GB) ................................. PCT/GB00/00911

(51) Int. Cl.[7] ......................... H05B 33/12; C08G 73/02
(52) U.S. Cl. ..................... 428/690; 428/917; 313/504; 313/506; 257/40; 528/394; 528/401; 528/422
(58) Field of Search ................................ 428/690, 917; 313/504, 506; 257/40; 528/401, 422, 394

(56) References Cited

U.S. PATENT DOCUMENTS 5,900,327 A    5/1999   Yu et al.
5,968,675 A   10/1999   Enokida et al.

FOREIGN PATENT DOCUMENTS

JP          11087066 A  *  3/1999  ........... H05B/33/22
WO          99 32537       7/1999
WO          99 54385      10/1999

OTHER PUBLICATIONS

"Materials and Fabrication of Organic Bilayer EL Device Preparation of Aromatic Tertiary Amines as Hole Transport Agent and Their Current–Voltage Characteristics", Abe et al., Nippon Kagaku Kaishi, (1997), (2), p. 134–138.*
International Search Report, PCT/GB01/01037, ISA/EPO, Jun. 25, 2001.

* cited by examiner

Primary Examiner—Dawn Garrett
(74) Attorney, Agent, or Firm—Harness, Dickey & Pierce, P.L.C.

(57) ABSTRACT

A copolymer for use in an electroluminescent device comprising a first repeat unit, a second repeat unit comprising a group having a general formula (I) and optionally, a third repeat unit comprising a group having a general formula (II) which may be substituted or unsubstituted where T is a trifluoromethyl substituted benzene; Ar, Ar' and Ar" each independently comprise a substituted or unsubstituted aryl or heteroaryl group and m is 1 or 2

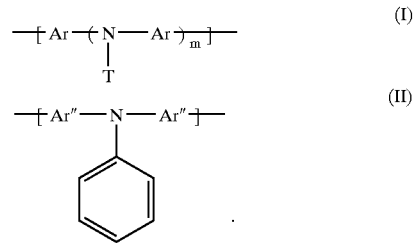

25 Claims, 11 Drawing Sheets

COPOLYMER

The present invention relates to a copolymer for use in an electroluminescent device and to its preparation and uses.

The basic structure of an electroluminescent device is a light-emissive layer sandwiched between two electrodes. One of the electrodes (the cathode) injects negative charge carriers (electrons) in the light-emissive layer and the other electrode (the anode) injects positive charge carriers (holes) in the light-emissive layers. The electrons and holes combine in the light-emissive layer generating photons. In a practical device, one of the electrodes is typically transparent, to allow the photons to escape the device.

U.S. Pat. No. 4,539,507 discloses an organic light-emissive material which is a small molecule material, such as (8-hydroxyquinolino) aluminium.

It is well known in this art that polymer materials are more useful than small molecule materials in electroluminescent devices insofar as they have superior device characteristics. In PCT/WO90/13148 the organic light-emissive material is a polymer. Specifically, the light-emissive organic layer is a film of poly(p-phenylene vinylene) (PPV).

In order for an electroluminescent device as described above to work, electrons must move from the cathode to the lowest unoccupied molecular orbital (LUMO) level of the light-emissive material and photons must move from the anode to the highest occupied molecular orbital (HOMO) level of the light-emissive material. The HOMO and LUMO levels of the light-emissive material can be estimated from measurements of electrochemical potentials for oxidation and reduction. It is well understood in the art that such energies are affected by a number of factors. Therefore, values used here are indicative rather than quantitative.

In order for an electron to move from the cathode to the LUMO level of the light-emissive material, the energy difference between the workfunction of the cathode and the LUMO level of the light-emissive material should be as small as possible. Similarly, in order for holes to move from the anode to the HOMO level of the light-emissive material, the workfunction of the anode should be matched as closely as possible to the HOMO level of the light-emissive material.

A particularly preferred anode which is used in electroluminescent devices is a layer of transparent indium-tin oxide with a workfunction of, for example, below 4.8 electron volts. Many light-emissive polymer materials have a HOMO energy level which is around 5.5 electron volts or higher. Clearly, in such cases, the workfunction of the anode is not well matched to the HOMO energy level of the light-emissive material.

One way of overcoming the above problem would be to choose another material for the anode. However, it is difficult to find a preferable alternative because indium-tin oxide has good transparency, low sheet resistance and established processing routes.

In view of the above problem, it is advantageous to provide a further layer between the anode and light-emissive layer which has a workfunction between the workfunction of the anode and the HOMO energy level of the light-emissive material. Such a layer helps the holes injected from the anode to reach the HOMO level in the light-emissive material. Such a layer typically is called a hole transport layer. EP0686662 discloses a device comprising a hole transport layer of doped polyethylene dioxythiophene ("PEDOT") This provides an intermediate energy level at approximately 4.8 electron volts. The exact workfunction of the PEDOT will depend on it's exact composition. However, in general, where an ITO anode is used, the layer of PEDOT may provide an intermediate energy level that is marginally higher than the workfunction of the ITO (see FIG. 1 in WO 99/148160). It will be appreciated that where the light-emissive material has a high eV HOMO energy level, for example at about 5.9 eV, this may still leave a significant energy barrier between the workstation of the hole transport layer and the HOMO energy level of the light-emissive material.

It should be noted here that a relative value for the workfunction of a hole transport material may be determined from the oxidation potential onset of the material as measured by cyclic voltametry. The oxidation potential onset is shown in the schematic cyclic voltamogram shown in FIG. 1. The oxidation potential onset is shown by reference numeral 1.

One way of overcoming this still significant energy barrier is to add further hole transport layers, so as to provide a series of intermediate energy steps between the anode and the light-emissive layer. However, there are no materials currently available which have good hole transport properties and which have also a high enough workfunction to be able to act as an intermediate hole transport layer by providing intermediate energy levels at, for example, 5.0 eV to 5.8 eV.

International Publication No. WO99/54385 discloses a copolymer comprising a fluorene-containing group and a triarylamine-containing group. The benzene of the triarylamine which is pendent to the polymer backbone may comprise a carboxyl, C1–C20 alkyl, C1–C20 alkoxy or a —CH$_2$R substituent. The use of these polymers as hole transport materials is suggested. However, these materials are unsuitable for use in a step-wise injection according to the present invention from the anode to the light-emissive layer using a series of intermediate energy steps because their workfunction, or oxidation potential onset, is not sufficiently high.

International Publication No. WO99/32537 discloses a further class of triarylamine-containing polymers which are suggested for use as charge transport materials in electroluminescent devices. However, the workfunction, or oxidation potential onset, of these polymers is not sufficiently high to allow using a series of these polymers in a series of different layers so as to provide step-wise injection access the active energy barrier between the anode and a light-emissive material having a HOMO level, for example, at about 5.7 eV by way of a series of intermediate energy steps.

The present invention overcomes the problems of the prior art by providing a new class of polymer where the workfunction can be varied up to a high value of about 5.8 eV whilst maintaining good hole transport properties. The workfunction is varied by varying the structure of the polymer so that a series of different layers of different of the present polymers may be provided between the anode and light-emissive layer in order to obtain a series of intermediate energy steps between the anode and the light-emissive layer.

The present invention provides a copolymer for use in an electroluminescent device comprising a first repeat unit —[Ar']—, a second repeat unit comprising a group having a general formula I:

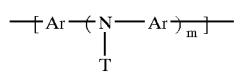

I and optionally, a third repeat unit comprising a group having a general formula II which may be substituted or unsubstituted:

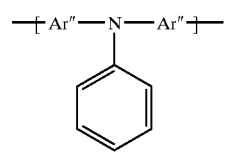

II where T is a trifluoromethyl substituted benzene; Ar, Ar' and Ar" each independently comprise a substituted or unsubstituted aryl or heteroaryl group and m is 1 or 2.

As mentioned above, the group having general formula II may be substituted or unsubstituted. In particular, the pendent phenyl group may be substituted or unsubstituted. The number and nature of substituents can be used to modify the workfunction of the polymer. Preferred substitutents include alkyl, alkoxy and —CO$_2$R groups where R is H or hydrocarbyl. A discussion of the effect of substitutents on molecular orbital energy levels (HOMO and LUMO levels) can be found in Chapter 2 of Color Chemistry (Synthesis, Properties and Applications of Organic Dyes and Pigments) by Heinrich Zollinger (2$^{nd}$ edition, 1991, VCH Publishers, Inc., New York, N.Y. (USA)).

Particularly preferred third repeat units include "TFMO", "TFB", "PFMO", "PFM", "PFB" and "BFA" as shown in FIG. 12 and as discussed in WO 99/48160.

The present copolymer includes random and block copolymers.

For the purposes of the present invention the term copolymer may be taken to mean any polymer which is not a homopolymer. A homopolymer may be defined as a polymer made from a single type of monomer.

The present invention also provides an electroluminescent device comprising:

a first charge carrier injecting layer for injecting positive charge carriers;
a second charge carrier injecting layer for injecting negative charge carriers;
a light-emissive layer located between the charge carrier injecting layers for accepting and combining positive and negative charge carriers to generate light; and
a transport layer for transporting positive charge carriers comprising a copolymer according to the present invention located between the first charge carrier injecting layer and the light-emissive layer.

It is not necessary for the polymer to be fully conjugated along its entire length, although it may be.

The present polymer is a copolymer, therefore, Ar' cannot be the same as the group having formula I.

The present polymers are soluble in typical organic solvents such as xylene. Therefore, they are solution processable when making an electroluminescent device comprising layers of polymers according to the present invention.

A preferred polymer in accordance with the present invention has a general formula:

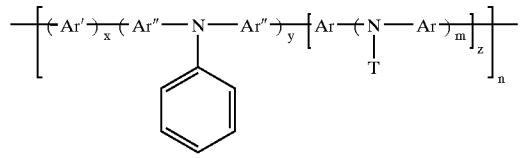

where m is 1 or 2, x≧1, y≧0, z≧1 and n is ≧2.

The trifluoromethyl substituent in a copolymer according to the present invention may be replaced by any perfluoroalkyl group. Alternatively, it may be replaced by another electron-withdrawing group such as a nitrile, acid amide, ketone, phosphinoyl, phosphonate, ester sulfone or sulfoxide group. As mentioned above, a discussion of the effect of substitutents on molecular orbital energy levels (HOMO and LUMO levels) can be found in Chapter 2 of Color Chemistry (Synthesis, Properties and Applications of Organic Dyes and Pigments) by Heinrich Zollinger (2$^{nd}$ edition, 1991, VCH Publishers, Inc., New York, N.Y. (USA)).

It is preferred that Ar and Ar" are each independently a substituted or unsubstituted benzene. It is further preferred that each Ar is an unsubstituted benzene.

Preferably, T is a meta- or para-trifluoromethyl benzene or a meta,meta-bistrifluoromethyl benzene.

Although Ar' may comprise other aromatic or heteroaromatic groups, the present inventors have found that particularly good control of the workfunction or oxidation potential onset may be achieved when Ar' comprises a substituted or unsubstituted fluorene, particularly a 9,9-dioctyl fluorene.

It is preferred that each Ar" is an unsubstituted benzene.

The present inventors have prepared polymers in accordance with the present invention as follows:

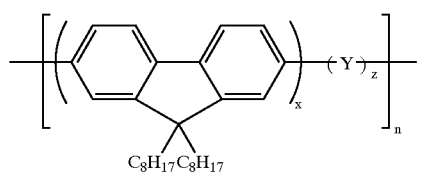

where x+z=1 and x=0.5, z=0.5 and Y is a group selected from:

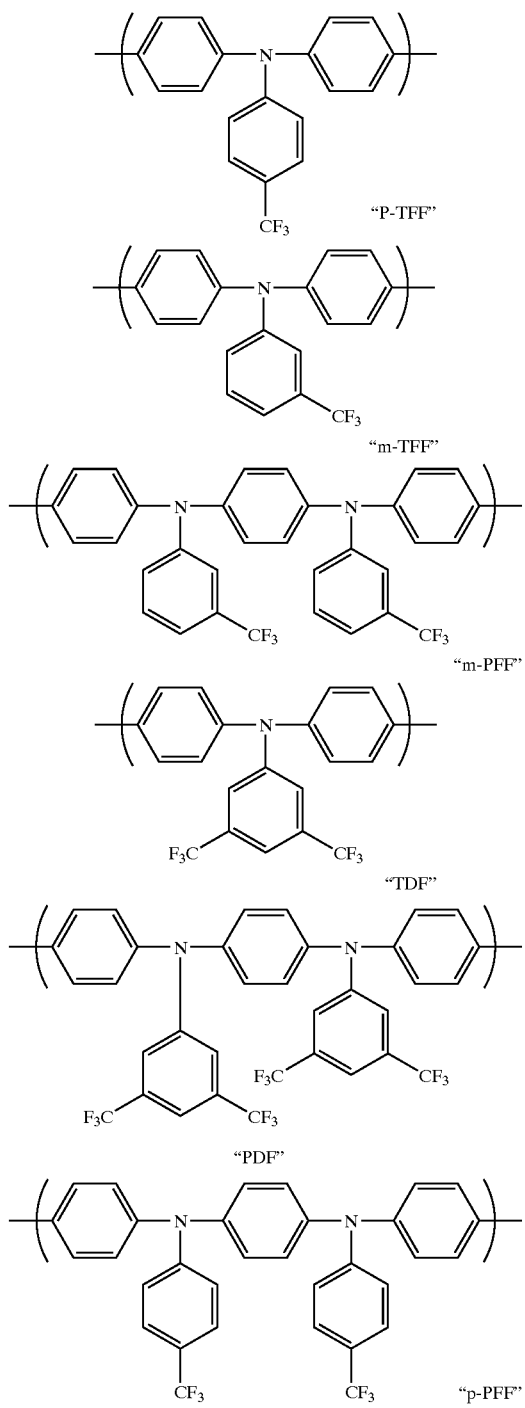

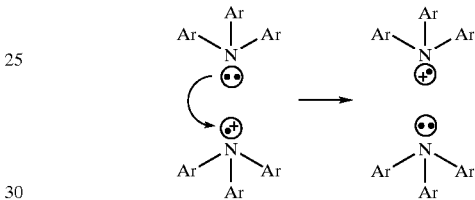

TABLE 1

| Alternating Copolymer | Oxidation Potential Onset/eV |
| --- | --- |
| F8-mTFF | 5.20 |
| F8-TDF | 5.53 |
| F8-pTFF | 5.49 |
| F8-mPFF | 5.20 |
| F8-mPDF | 5.41 |

As can be seen from Table 1 below, a series of polymers according to the present invention may be prepared so each polymer has a different oxidation potential onset within the range of 5.20 electron volts to 5.55 electron volts. By further modifying the polymer structure, further polymers according to the present invention could be prepared having oxidation potential onsets of between 4.80 electron volts to 5.80 electron volts.

Surprisingly, the present inventors have found that the effect of step-wise injection does not require the presence of a series of different layers of different polymers according to the present invention in order to provide a series of intermediate energy steps between the anode and the light-emissive layer. This is because of an intramolecular "hopping" effect.

"Hopping" between molecules is the known method of transporting positive charge carriers (holes). The action of "hopping" can be seen from the diagram below:

Hole transport by "hopping" in relation to triarylamines is reviewed Borsenberger, P. M.; Weiss, D. S. *Organic Photoreceptors for Imaging Systems;* Marcel Dekker: New York 1993. Law, K.-Y. *Chem. Rev.* 1993, 93, 449.

The present inventors have found that this same "hopping" effect is achievable along a polymer chain using polymers according to the present invention. As can be seen from the attached cyclic voltamograms (FIGS. 4 to 10) the discrete peaks which are visible each indicate a different oxidation potential. In other words, within a single polymer, different "types" of oxidation are occurring. Broadly speaking, each of these discrete peaks would indicate to the skilled person a separate energy level from which oxidation is occurring. Therefore, it can be seen that within a single polymer, a series of different and discrete energy levels is provided which provides a series of intermediate energy steps which help hole transport from the anode to the HOMO level in the light-emissive layer, even when only a single layer. This is achieved by only a single layer of a polymer according to the present invention when provided as a hole transport layer in an electroluminescent device.

The concept of this intramolecular "hopping" effect is a completely new concept in this art. There has been no previous suggestion that it would be possible to provide a series of intermediate energy steps along the length of a single polymer chain which would help hole transport from an anode to the HOMO level of a light-emissive material. Without wishing to be bound by theory it is suggested that this effect has been realised only with polymers according to the present invention.

Several different polymerisation methods are known which may be used to manufacture polymers in accordance with the present invention.

One suitable method is disclosed in International patent publication No. WO 00/53656, the contents of which are incorporated herein by reference. This describes a process for preparing a conjugated polymer, which comprises polymerising in a reaction mixture (a) an aromatic monomer having at least two reactive boron derivative groups selected from a boronic acid group, a boronic ester group and a boron group, and an aromatic monomer having at least two reactive halide functional groups; or (b) an aromatic monomer having one reactive halide functional group and one reactive boron derivative group selected from a boronic acid group, a boronic ester group and a borane group, wherein the reaction mixture comprises a catalytic amount of a catalyst suitable for catalysing the polymerisation of the aromatic monomers, and an organic base in an amount sufficient to convert the reactive boron derivative functional groups into —$BX_3$ anionic groups, wherein X is independently selected from the group consisting of F and OH.

Polymers according to the present invention which have been produced by this method are particularly advantageous. This is because reaction times are short, residual catalyst (e.g. palladium) levels are low and the resultant polymers have relatively high molecular weights, as disclosed in WO 00/53656.

Another polymerisation method is disclosed in U.S. Pat. No. 5,777,070. Commonly, this process is known as "Suzuki polymerisation". The process involves contacting monomers having two reactive groups selected from boronic acid, C1–C6 boronic acid ester, C1–C6 borane and combinations thereof with aromatic dihalide functional monomers or monomers having one reactive boronic acid, boronic acid ester or boron group and one reactive halide functional group with each other in the presence of inorganic base and phase transfer catalyst.

The present polymer may be used in an optical device such as an optical device comprising an electroluminescent device.

Usually, such electroluminescent devices would comprise a first charge carrier injecting layer for injecting positive charge carriers, a second charge carrier injecting layer for injecting negative charge carriers and a light-emissive layer comprising a light-emissive material located between the charge carrier injecting layers for accepting and combining positive and negative charge carriers to generate light.

Optionally, the electroluminescent device may comprise a material for transporting negative charge carriers. This may either be located between the second charge carrier injecting layer and the light emissive-layer or may be located in the light-emissive layer. Where it is located in the light-emissive layer, it may be blended in a mixture with the light-emissive material.

In accordance with the present invention, the electroluminescent device also will comprise a polymer according to the present invention. It is envisaged that the polymer according to the present invention will be for transporting positive charge carriers although it may be useful additionally or alternatively as an emissive material or even a material for transporting negative charge carriers. When the present polymer is for transporting positive charge carriers it may be located between the first charge carrier injecting layer (and optionally further layers for transporting positive charge carriers) and the light-emissive layer or may be located in the light-emissive layer. Where it is located in the light-emissive layer, it may be blended in a mixture with, for example, the light-emissive material and optionally a material for transporting negative charge carriers, further polymers according to the present invention and/or other materials for transporting positive charge carriers. Typically, a polymer according to the present invention would be incorporated into such a blend at a level of 20% to 80%.

Preferably, the polymer according to the present invention is blended to form a composition with one or more polymer, specifically a hole and/or electron-transporting polymer and/or light-emissive polymer. Most preferably it is blended with up to 2 different polymers according to the present invention.

BRIEF DESCRIPTION OF DRAWINGS

The present invention will now be described in further detail with reference to the following drawings in which.

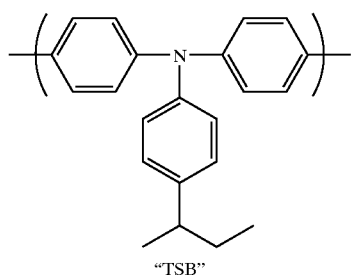

"TSB"

Figure 1:
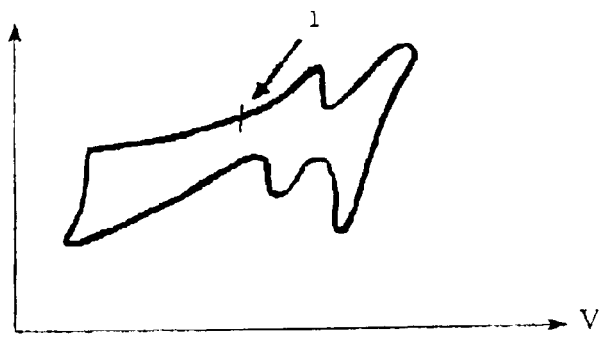
FIG. 1 is a schematic cyclic voltamogram showing the oxidation potential onset (1)
Figure 2:
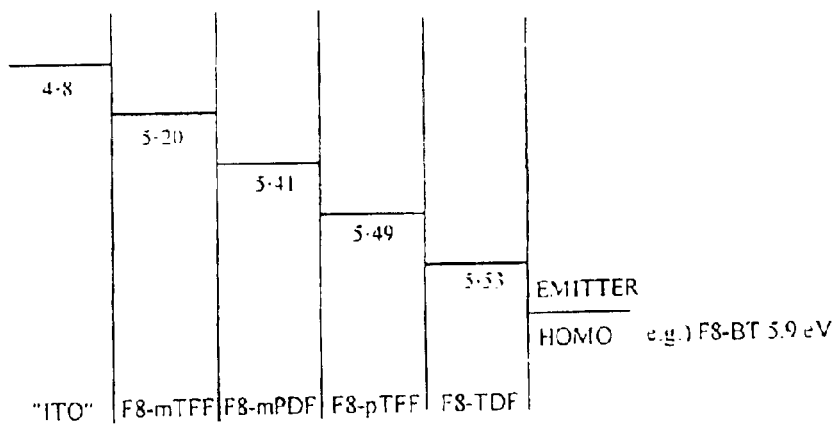
FIG. 2 shows an energy level diagram showing a suggested layering structure for the anode, hole transport layers and light-emissive layer in a device according to the present invention.
Figure 3:
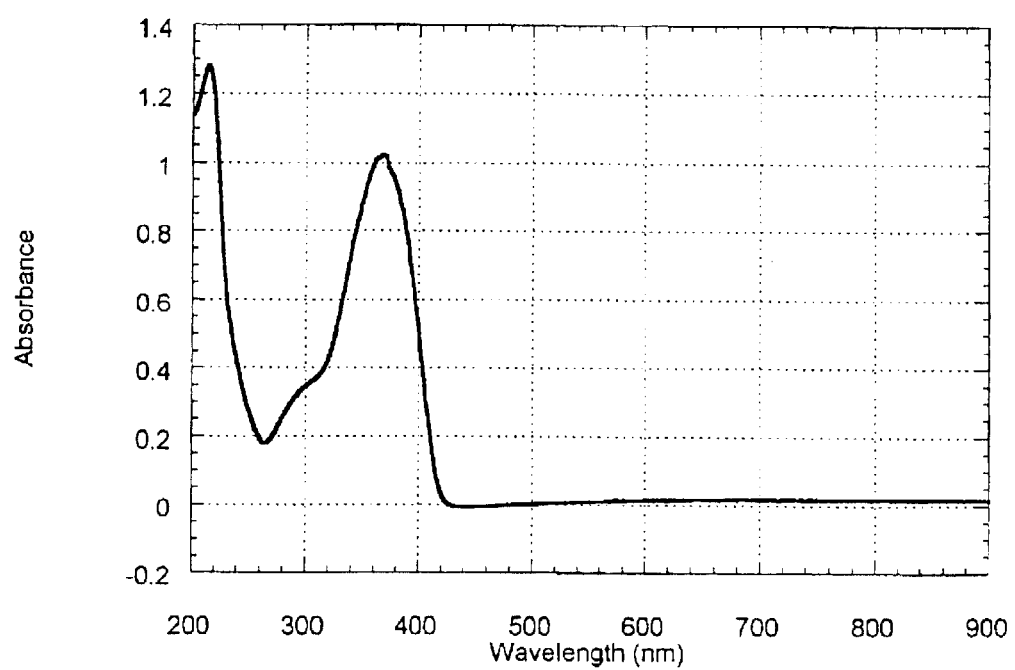
FIG. 3 shows the UV absorption spectrum for the copolymer prepared in accordance with Example 2.
Figure 4:
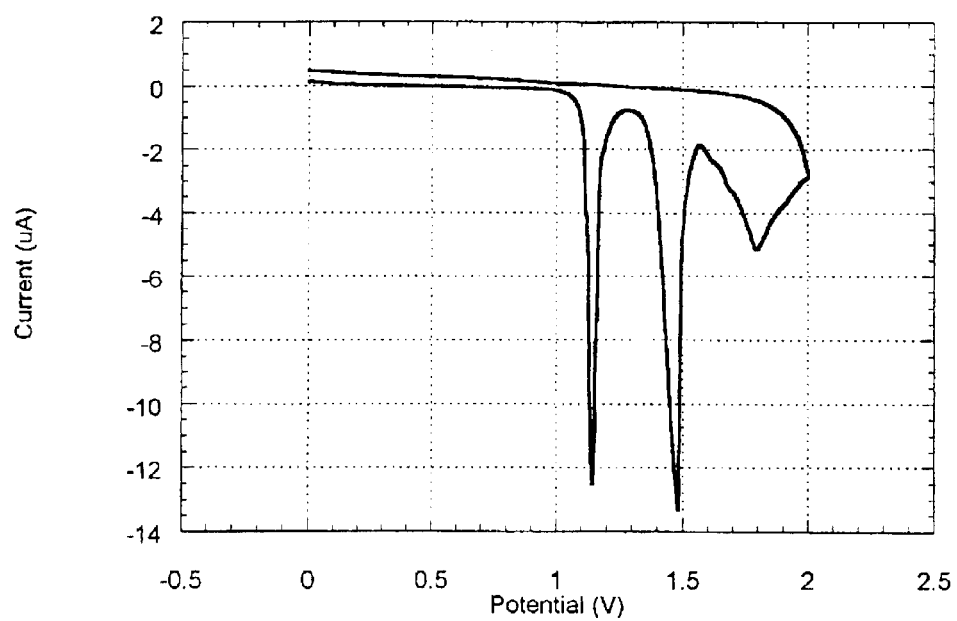
FIG. 4 shows a cyclic voltamogram for a copolymer prepared in accordance with Example 2.
Figure 5:
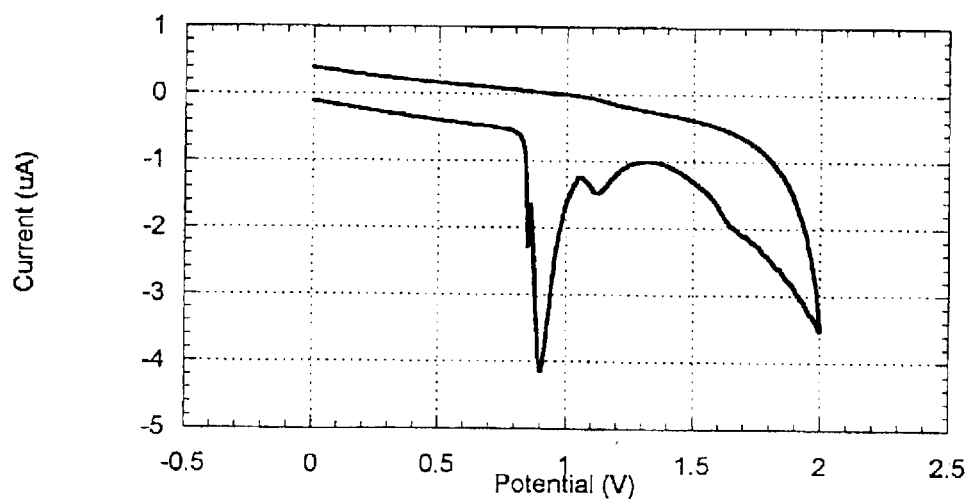
FIG. 5 shows the cyclic voltamogram for a copolymer prepared in accordance with Example 3.
Figure 6:
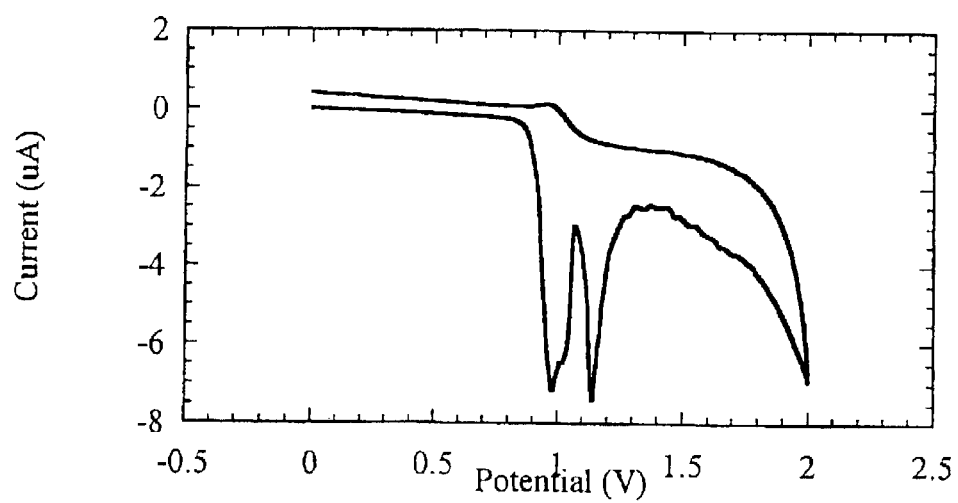
FIG. 6 shows a cyclic voltamogram for a copolymer prepared in accordance with Example 4.
Figure 7:
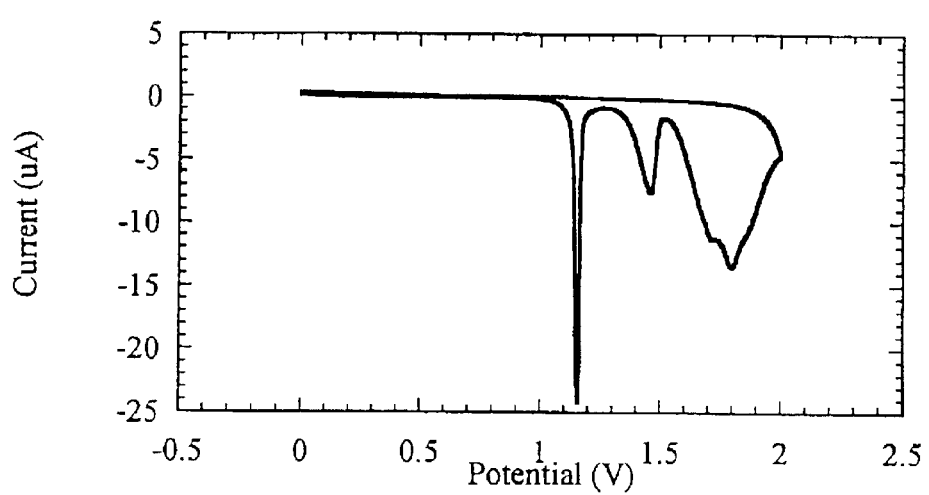
FIG. 7 shows a cyclic voltamogram for a copolymer prepared in accordance with Example 5.
Figure 8:
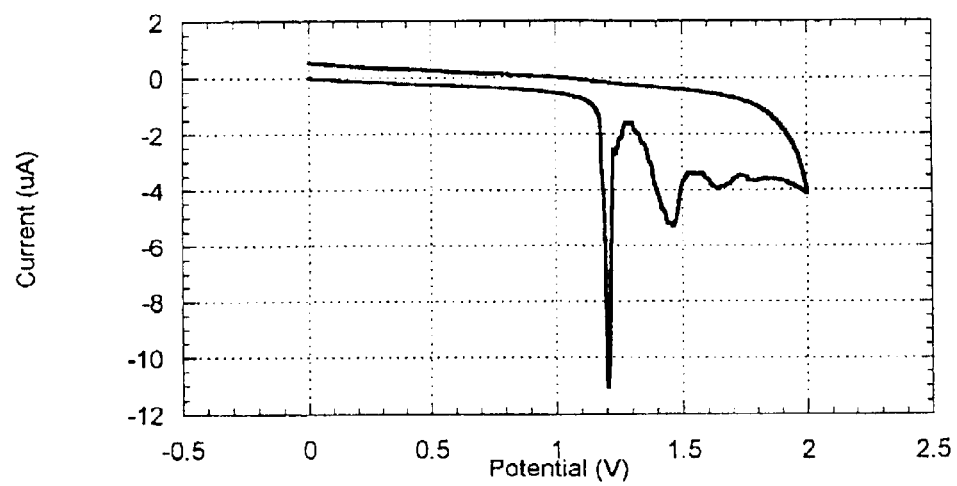
FIG. 8 shows a cyclic voltamogram for a copolymer prepared in accordance with Example 6.
Figure 9:
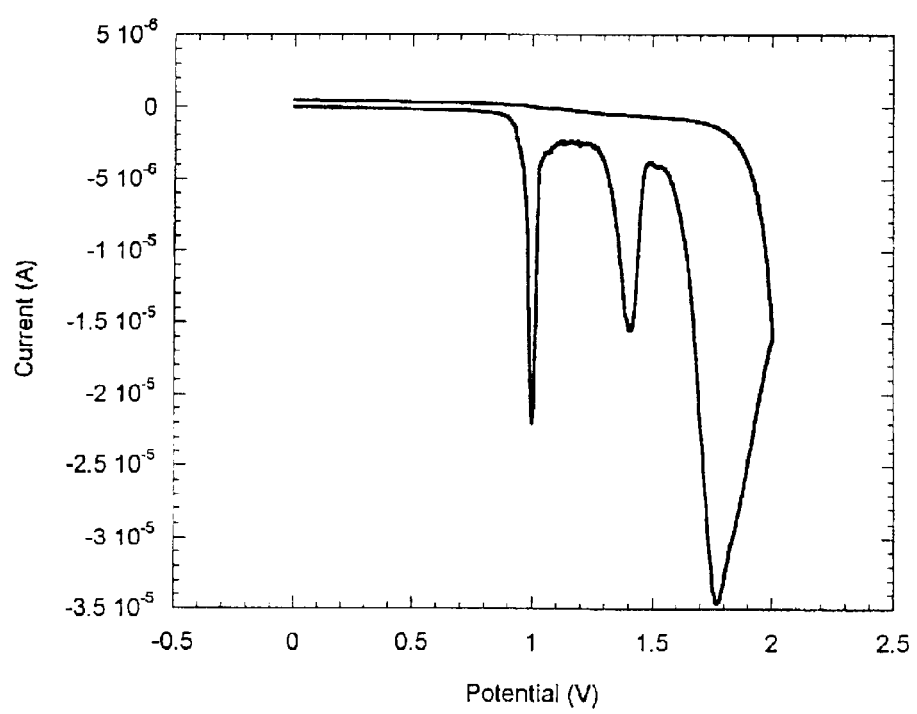
FIG. 9 is a comparative cyclic voltamogram for a copolymer comprising alternating repeat units of F8.
Figure 10:
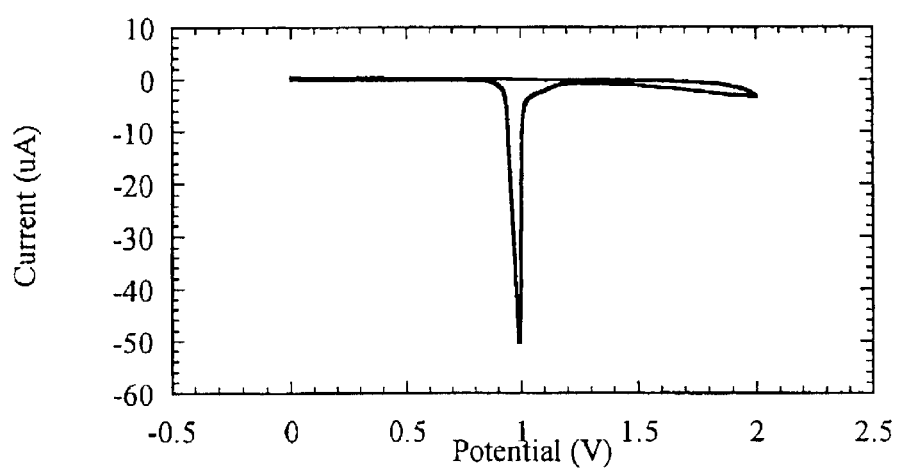

FIG. 10 is a cyclic voltamogram for a copolymer comprising alternating units of F8, pTFF and TSB.

Figure 11:
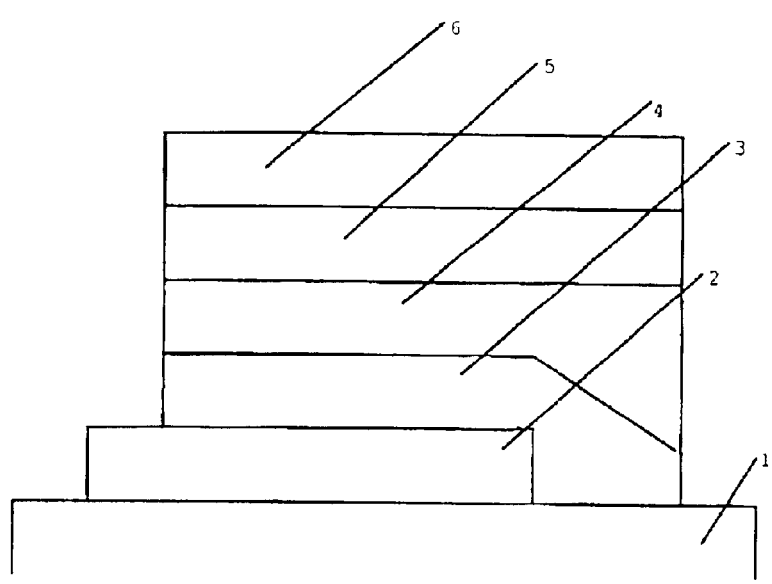

FIG. 11 is a side view if a multi-layered device structure; and

Figure 12:
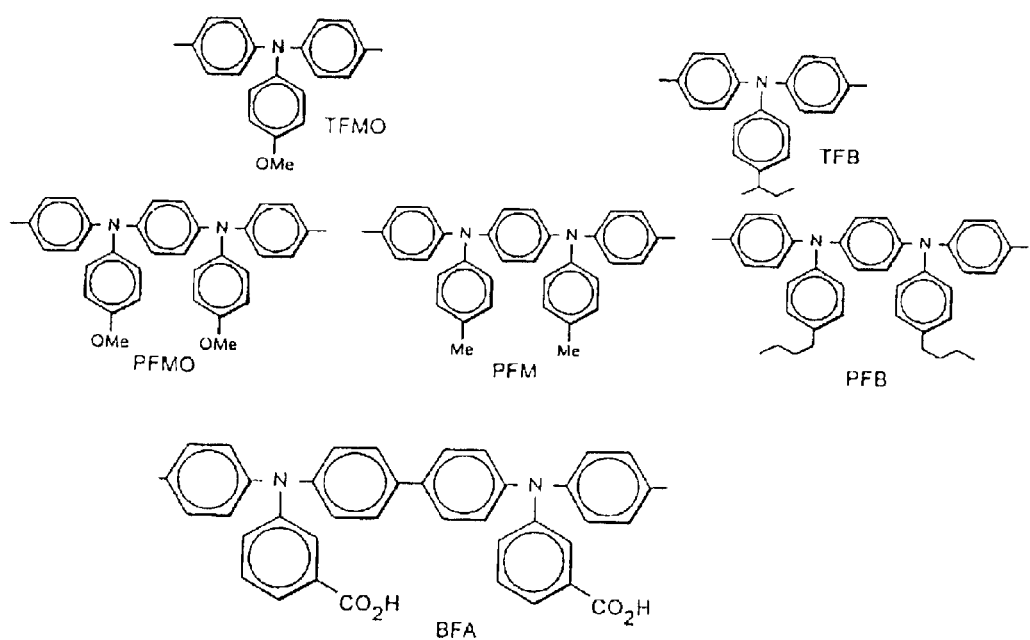

FIG. 12 demonstrates the structures of certain preferred third repeating units.

The polymer may be conjugated to the extent that localised regions of conjugation exist along the polymer backbone.

EXAMPLES

Characterisation of the copolymers prepared in Examples 2 to 7 is shown in Table 1.

Example 1
Preparation of mTFF Monomer (a) Preparation of N,N-diphenyl-(m-trifluoromethyl) aniline (mTFF monomer precursor).

In a 500 ml three necked round bottomed flask is placed diphenylamine (15.57 g, 92 mmol), (3-trifluoromethyl) iodobenzene (31.43 g, 115 mmol), palladium acetate (404 mg, 1.8 mmol), tri-o-tolylphosphine (1.19 g, 3.9 mmol), sodium t-butoxide (12.50 g, 130 mmol), and toluene (200 ml). The suspension was stirred at reflux under nitrogen for 12 hours. The mixture was filtered through celite, and then concentrated before being columned using toluene as eluent. After Kugelrohr distillation (0.01 mm Hg, 145° C.) a clear oil remained which solidifies. Yield of product is 23.16 g (80%) of material of 98.5% purity (HPLC).

(b) Preparation of N,N-di-p-bromophenyl-(m-trifluoromethyl)aniline) (mTFF monomer).

N,N-diphenyl-(m-trifluoromethyl)aniline (23.16 g, 74 mmol) was dissolved in 200 ml of dry DMF and with stirring under nitrogen a solution of N-bromosuccinimide (27.6 g, 155 mmol) in DMF (200 ml) was added dropwise maintaining the internal temperature below 20° C. After one hour the solution was precipitated into 3 L of water. The crude product was filtered and recrystallised several times from pet-ether (80/100) to give 15.2 g of pure product.

This experimental procedure for the preparation of mTFF preparation can be directly adapted for the synthesis of the other trifluoromethyl-containing triarylamine monomers used in Examples 3 to 7.

Example 2
Preparation of F8-mTFF Polymer

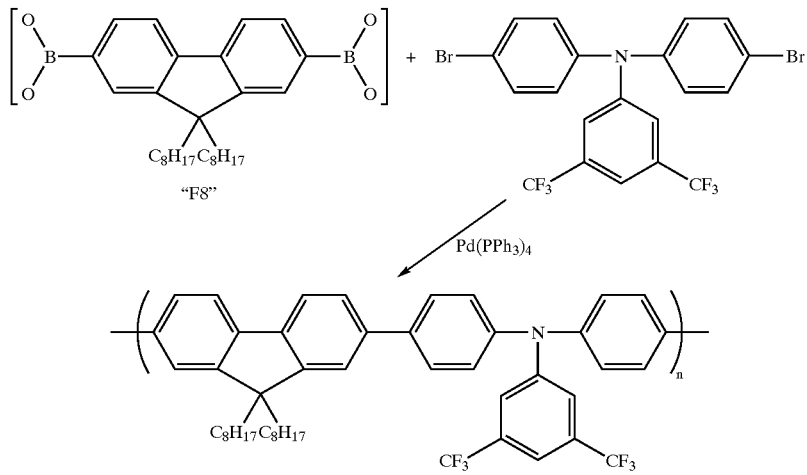

Into a 500 ml three necked flask equipped with mechanical stirrer, condenser and nitrogen inlet were placed mTFF monomer (4.4002 g, 9.34 mmol), F8-diester (4.9535 g, 9.34 mmol), Pd(PPh3)4 (35 mg), toluene (100 ml) and aqueous tetraethylammonium hydroxide solution (30 ml of 20 wt %). The mixture was purged with stirring for 15 minutes before raising the temperature to reflux. Heating was continued for 48 hours. The polymer was endcapped for 30 minutes with 1 m of bromobenzene and then for 30 minutes with 1 g of phenylboronic acid before being precipitated into a large excess of methanol. The polymer was dissolved in 200 ml of toluene and washed successively with disodium diethyldithiocarbamate solution, dilute HCl (aq.) and distilled water. The organic phase was separated and passed through a column of alumina/silica, eluting with toluene. The volume of the solution was reduced by evaporation before being precipitated into methanol, filtered and dried. Yield was 3.60 g (55%).

Example 3
Preparation of F8-mPFF Polymer
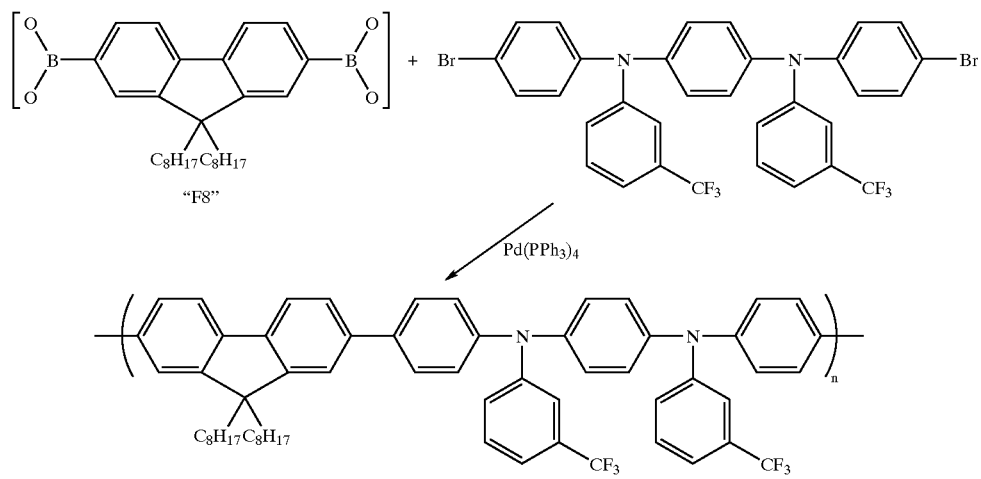
This copolymer was prepared in accordance with the protocol set out in Example 2.
Example 4
Preparation of F8-pPFF Polymer
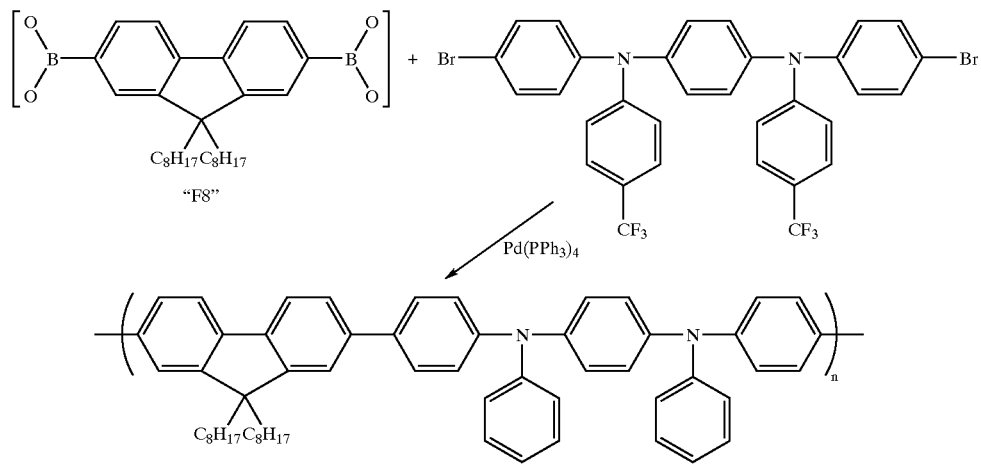
This copolymer was prepared in accordance with the protocol set out in Example 2.

Example 5
Preparation of F8-pTFF Polymer
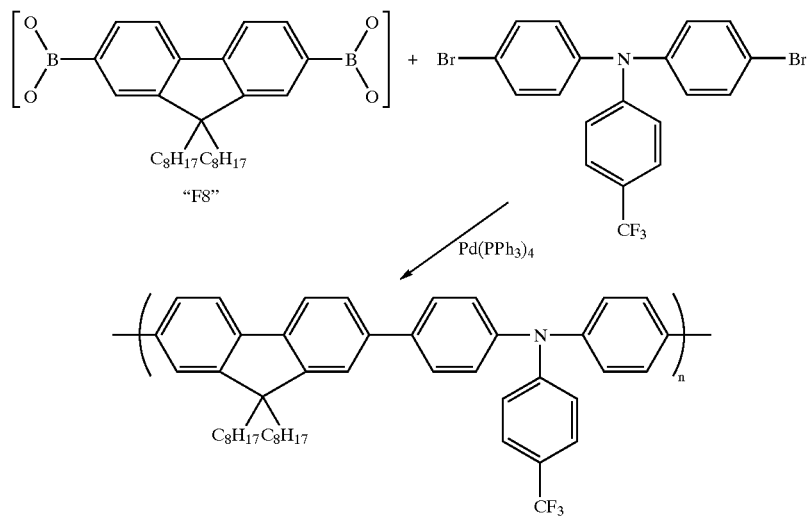
This copolymer was prepared in accordance with the protocol set out in Example 2.
Example 6
Preparation of F8-TDF Polymer
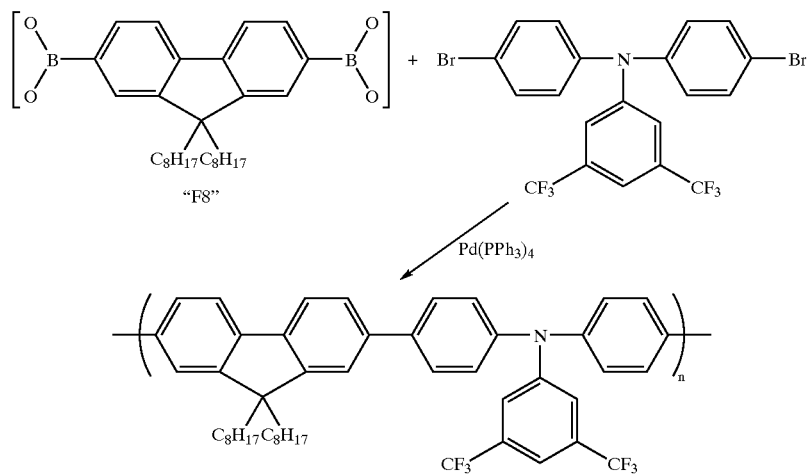
This copolymer was prepared in accordance with the protocol set out in Example 2.

Example 7
Preparation of F8-PDF Polymer

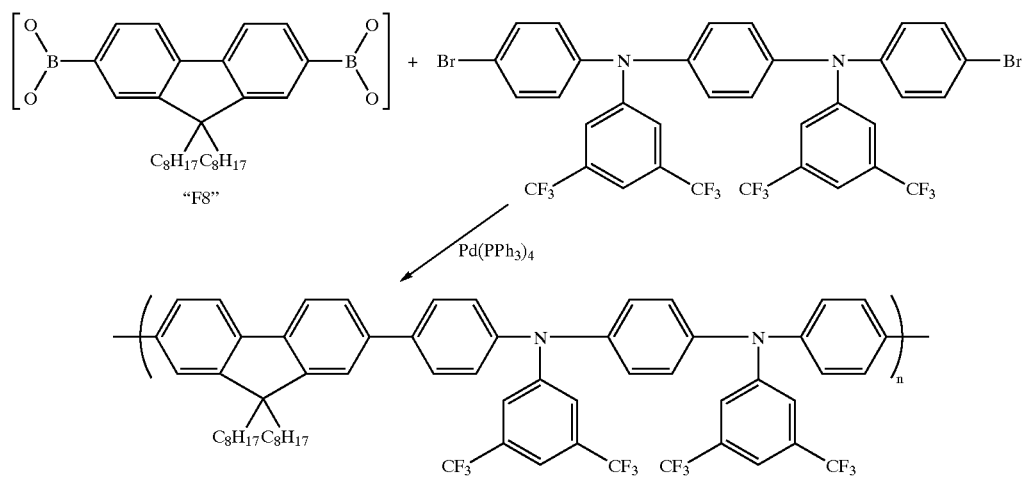

This copolymer was prepared in accordance with the protocol set out in Example 2.

Example 8
An Optical Device

A suitable device structure is shown in FIG. 11. The anode 2 is a layer of transparent indium-tin oxide ("ITO") supported on a glass or plastic substrate 1. The anode 2 layer has a thickness between 1000–2000 Å, usually about 1500 Å. The cathode 5 is a Ca layer having an approximate thickness of 1500 Å. Between the electrodes is a light emissive layer 4 having a thickness up to about 1000 Å. The emissive layer 4 comprises between about 0.5 to about 30% by weight of a light-emissive polymer (e.g. about 5%). The number of different polymers according to the present invention included in the device (as descrete layers or as components of a blend) will vary depending on, for example, the light-emissive polymer. Advantageously, the device includes a hole transport material layer 3 of PEDOT having a thickness of about 1000 Å. Layer 6 is an encapsulant layer of a suitable thickness.

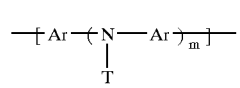

and optionally, a third repeat unit comprising a group having a general formula II which may be substituted or unsubstituted:

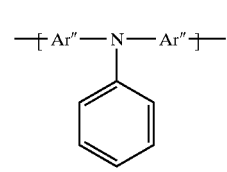

where T is a trifluoromethyl substituted benzene; Ar, Ar' and Ar" each independently comprise a substituted or unsubstituted aryl or heteroaryl group and m is 1 or 2.

TABLE 1

| Copolymer | UV-Vis I Max (nm) | UV-Vis Eg (eV) | Cyclic Voltammetry HOMO (eV) peak | Cyclic Voltammetry HOMO (eV) onset | Cyclic Voltammetry LUMO (eV) peak | Cyclic Voltammetry LUMO (eV) onset | Molecular Weight (polystyrene equivalents) Mn | Molecular Weight (polystyrene equivalents) Mp | Molecular Weight (polystyrene equivalents) Pd |
|---|---|---|---|---|---|---|---|---|---|
| Example 2 | 368 | 2.97 | 5.54 | 5.46 | N/A | N/A | 36400 | 76500 | 2.44 |
| Example 3 | 363 | 2.97 | 5.21 | 5.20 | N/A | N/A | 31900 | 53000 | 1.96 |
| Example 4 | | | | | | | 47000 | 104500 | 2.32 |
| Example 5 | | | 5.51 | 5.49 | N/A | N/A | | | |
| Example 5 (repeat) | | | 5.50 | 5.48 | N/A | N/A | | | |
| Example 6 | | | 5.56 | 5.53 | N/A | N/A | 32900 | 64400 | 1.94 |
| Example 7 | 351 | 3.05 | 5.41 | 5.33 | N/A | N/AA | 43200 | 74500 | |

What is claimed is:

1. A copolymer for use in an electroluminescent device comprising a first repeat unit $-\!\!\!+\!\!Ar'\!\!+\!\!\!-$, a second repeat unit comprising a group having a general formula I:

2. A copolymer according to claim 1, wherein Ar and Ar" are each independently a substituted or unsubstituted benzene.

3. A copolymer according to claim 2, wherein each Ar" is an unsubstituted benzene.

4. A copolymer according to claim 2 or claim 3, wherein each Ar is an unsubstituted benzene.

5. A copolymer according to claim 1 where T is a meta- or para-trifluoromethyl benzene or a meta, meta-trifluoromethyl benzene.

6. A copolymer according to claim 1, wherein AR' comprises a substituted or unsubstituted fluorene.

7. A copolymer according to claim 6, wherein Ar' comprises 9, 9-dioctyl-fluorene.

8. A copolymer according to claim 7, having a general formula:

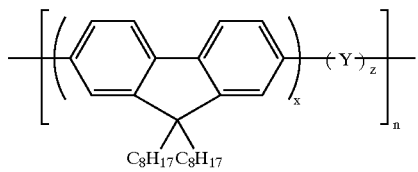

where x+z=1, and x=0.5, z=0.5, and n≧2 and Y is a group selected from

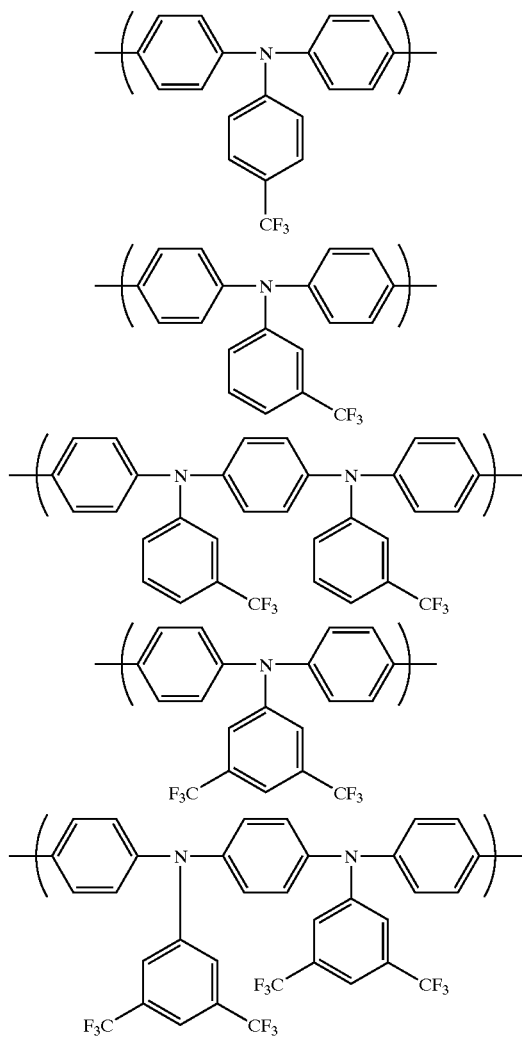

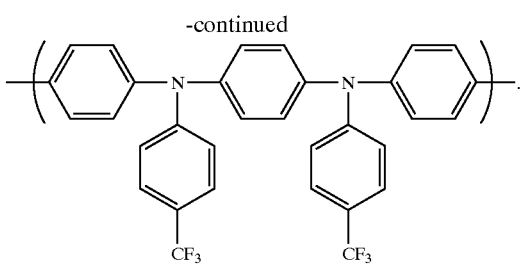

9. A copolymer according to claim 1 having an oxidation potential onset in the range from 4.80 eV to 5.80 eV.

10. A copolymer according to claim 9 having an oxidation potential onset in the range 5.20 eV to 5.55 eV.

11. A copolymer according to claim 1 having two or more different oxidation potentials.

12. An electroluminescent device comprising:
   a first charge carrier injecting layer for injecting positive charge carriers;
   a second charge carrier injecting layer for injecting negative charge carriers;
   a light-emissive layer located between the charge carrier injecting layers for accepting and combining positive and negative charge carriers to generate light; and
   a transport material for transporting positive charge carriers comprising a polymer according to any one of claims 1 to 11 located as a layer between the first charge carrier injecting layer and the light-emissive layer or located in the light-emissive layer.

13. An electroluminescent device according to claim 12, further comprising one or more further transport materials for transporting positive charge carriers located as one or more layers between the transport layer and the light-emissive layer or located in the light-emissive layer, where each of the one or more further transport layers has a different oxidation potential onset from the transport layer or other further transport layers.

14. A process for preparing a polymer according to claim 1, which comprises polymerising in a reaction mixture:
   (a) a first aromatic monomer comprising either
      (i) a first repeat unit ─[Ar']─ where Ar' comprises a substituted or unsubstituted aryl or heteroaryl group; or
      (ii) a second repeat unit having a general formula:

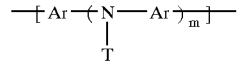

where T is a trifluoromethyl substituted benzene; Ar, Ar' and Ar" each independently comprise a substituted or unsubstituted aryl or heteroaryl group and m is 1 or 2, and at least two reactive boron derivative groups selected from a boronic acid group, a boronic ester group and a borane group; and
   (b) a second aromatic monomer comprising the other of the first or second repeat units and at least two reactive halide functional groups, wherein the reaction mixture contains a catalytic amount of a palladium catalyst, and an organic base in an amount sufficient to convert the reactive boron derivative groups into ─B(OH)$_3$─.

15. A process for preparing a polymer according to claim 1, which comprises polymerising in a reaction mixture:
   (a) a first aromatic monomer comprising either
      (i) a first repeat unit ─[Ar']─ where Ar' comprises a substituted or unsubstitutedaryl or heteroaryl group; or (ii) a second repeat unit having a general formula:

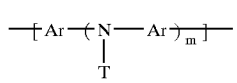

where T is a trifluoromethyl substituted benzene; Ar, Ar' and Ar" each independently comprise a substituted or unsubstituted aryl or heteroaryl group and m is 1 or 2, and one reactive halide functional group and one reactive boron derivative group; and (b) a second aromatic monomer comprising the other of the first or second repeat units and one reactive halide functional group and one reactive boron derivative group, wherein each borane derivative group is selected from a boronic acid group, a boronic ester group and a borane group and the reaction mixture comprises a catalytic amount of a palladium catalyst, and an organic base in amount sufficient to convert the reactive boron derivative groups into —B(OH)$_3$-anions.

16. The process according to claim 14, wherein Ar and Ar" are each independently a substituted or unsubstituted benzene.

17. The process according to claim 14, where T is a meta- or para-trifluoromethyl benzene or a meta, meta-trifluoromethyl benzene.

18. The process according to claim 14, wherein Ar' comprises a substituted or unsubstituted fluorine.

19. The process according to claim 14, wherein Ar' comprises 9, 9-dioctyl-fluorene.

20. The process according to claim 14, having a general formula:

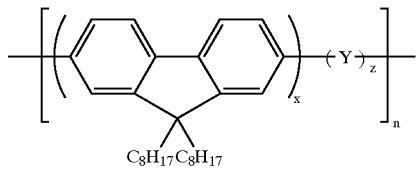

where x+z=1, and x=0.5, z=0.5, and n≧2 and Y is a group selected from

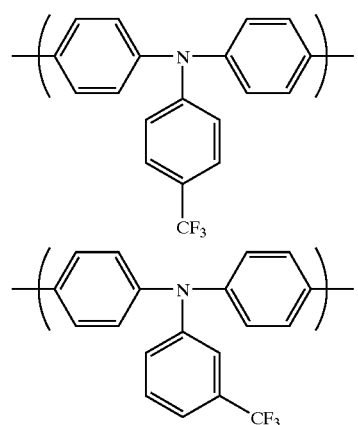

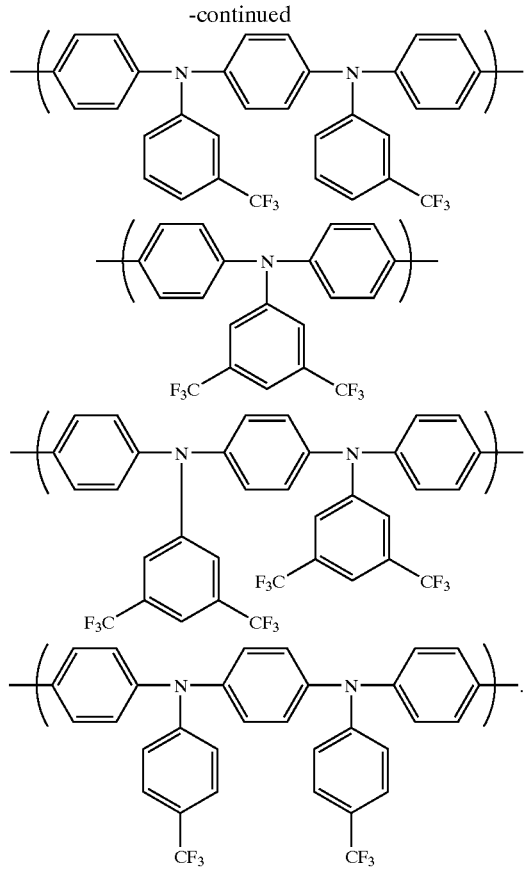

21. The process according to claim 15, wherein Ar and Ar" are each independently a substituted or unsubstituted benzene.

22. The process according to claim 15, where T is a meta- or para-trifluoromethyl benzene or a meta, meta-trifluoromethyl benzene.

23. The process according to claim 15, wherein Ar' comprises a substituted or unsubstituted fluorine.

24. The process according to claim 15, wherein Ar' comprises 9, 9-dioctyl-fluorene.

25. The process according to claim 15, having a general formula:

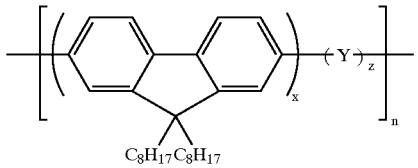

where x+z=1, and x=0.5, z=0.5, and n≧2 and Y is a group selected from

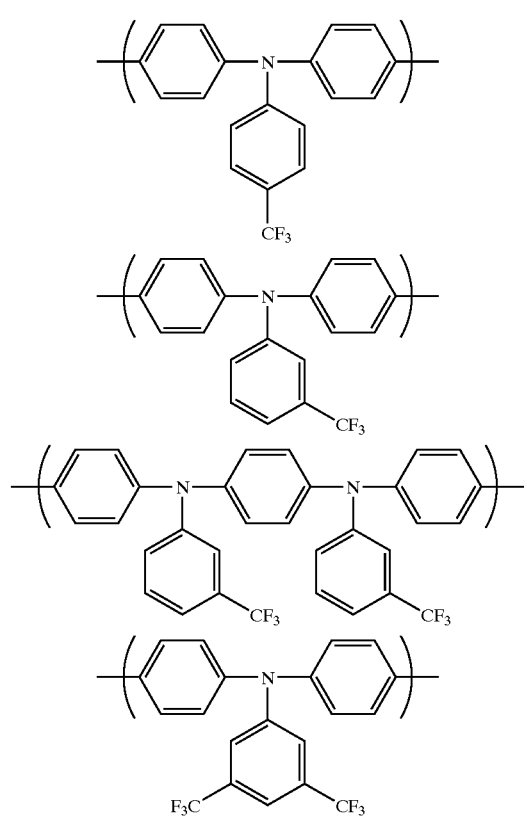
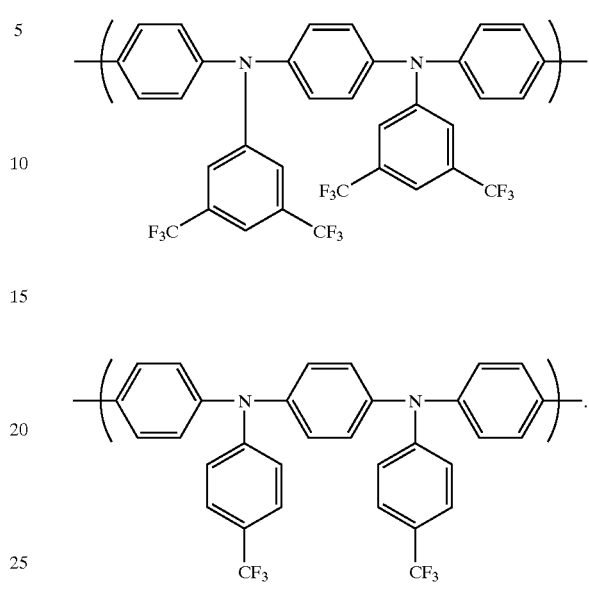
* * * * *